United States Patent
Chang et al.

(10) Patent No.: US 9,250,406 B2
(45) Date of Patent: Feb. 2, 2016

(54) ELECTRO-OPTICAL ASSEMBLY INCLUDING A GLASS BRIDGE

(71) Applicant: INTEL CORPORATION, Santa Clara, CA (US)

(72) Inventors: Peter L. D. Chang, Portland, OR (US); Edris M. Mohammed, Beaverton, OR (US); Henning Braunisch, Chandler, AZ (US); Hengju Cheng, Mountain View, CA (US)

(73) Assignee: Intel Corporation, Santa Clara, CA (US)

(*) Notice: Subject to any disclaimer, the term of this patent is extended or adjusted under 35 U.S.C. 154(b) by 436 days.

(21) Appl. No.: 13/722,951

(22) Filed: Dec. 20, 2012

(65) Prior Publication Data

US 2014/0177625 A1 Jun. 26, 2014

(51) Int. Cl.
*G02B 6/12* (2006.01)
*G02B 6/43* (2006.01)

(52) U.S. Cl.
CPC .............. *G02B 6/43* (2013.01); *Y10T 29/4913* (2015.01); *Y10T 29/49117* (2015.01)

(58) Field of Classification Search
CPC .... G02B 6/43; G02B 6/12002; G02B 6/4269; G02B 6/4272; H01L 27/0688
See application file for complete search history.

(56) References Cited

U.S. PATENT DOCUMENTS

| | | | | |
|---|---|---|---|---|
| 6,052,498 A * | 4/2000 | Paniccia | | 385/14 |
| 7,228,020 B2 * | 6/2007 | Weigert | | 385/14 |
| 7,230,278 B2 * | 6/2007 | Yamada et al. | | 257/80 |
| 7,271,461 B2 * | 9/2007 | Dutta | | 257/432 |
| 7,292,744 B2 * | 11/2007 | Ouchi | | 385/14 |
| 7,427,804 B2 * | 9/2008 | Yamada et al. | | 257/678 |
| 7,488,119 B2 * | 2/2009 | Yoshida et al. | | 385/89 |
| 7,539,366 B1 * | 5/2009 | Baks et al. | | 385/14 |
| 7,851,811 B2 * | 12/2010 | Dutta | | 257/84 |
| 7,851,816 B2 * | 12/2010 | Dutta | | 257/98 |
| 8,265,432 B2 * | 9/2012 | Doany et al. | | 385/14 |
| 8,319,230 B1 * | 11/2012 | Dutta | | 257/82 |
| 8,766,284 B1 * | 7/2014 | Dutta | | 257/82 |
| 2004/0086011 A1 * | 5/2004 | Bhandarkar | | 372/43 |
| 2005/0087747 A1 * | 4/2005 | Yamada et al. | | 257/80 |
| 2006/0045413 A1 * | 3/2006 | Weigert | | 385/15 |
| 2007/0122088 A1 * | 5/2007 | Yoshida et al. | | 385/89 |
| 2007/0221931 A1 * | 9/2007 | Yamada et al. | | 257/80 |
| 2011/0243509 A1 * | 10/2011 | Wang | | G02B 6/4246 385/88 |
| 2013/0230280 A1 * | 9/2013 | Kadar-Kallen | | 385/33 |
| 2014/0119689 A1 * | 5/2014 | Yabre et al. | | 385/14 |
| 2014/0177625 A1 * | 6/2014 | Chang et al. | | 370/351 |

OTHER PUBLICATIONS

Schow, Clint L., "Power-Efficient Transceivers for High-Bandwidth, Short-Reach Interconnects," OFC/NFOEC Technical Digest, Optical Society of America, Optical Fiber Communication Conference, Los Angeles, California, Mar. 4, 2012, 3 pages.

* cited by examiner

Primary Examiner — Rhonda Peace
(74) Attorney, Agent, or Firm — Schwabe, Williamson & Wyatt, P.C.

(57) ABSTRACT

Embodiments of the present disclosure provide techniques and configurations for routing signals of an electro-optical assembly using a glass bridge. In one embodiment, an electro-optical assembly includes a laser die having a laser device and a glass bridge electrically coupled with the laser die by one or more interconnect structures, the glass bridge including electrical routing features configured to route electrical signals to the laser die from a transmitter device. Other embodiments may be described and/or claimed.

25 Claims, 4 Drawing Sheets

ELECTRO-OPTICAL ASSEMBLY INCLUDING A GLASS BRIDGE

FIELD

Embodiments of the present disclosure generally relate to the field of electro-optical integrated circuit (IC) devices, and more particularly, to a glass bridge for routing signals of an electro-optical assembly.

BACKGROUND

Light signals may be used to communicate information between integrated circuits (ICs) such as ICs formed on different dies. Presently, electrical signals between transmitter (Tx) and receiver (Rx) components and respective laser and photodetector components of an electro-optical assembly may be routed using bonding wires or a semiconductor interposer having through holes for the light signals. However, routing by such techniques may be difficult to manufacture or may be difficult to integrate with other components, in particular, for larger arrays of laser devices. For example, the bonding wires may allow for parasitic effects that are difficult to control or the through holes may be difficult to manufacture and integrate.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
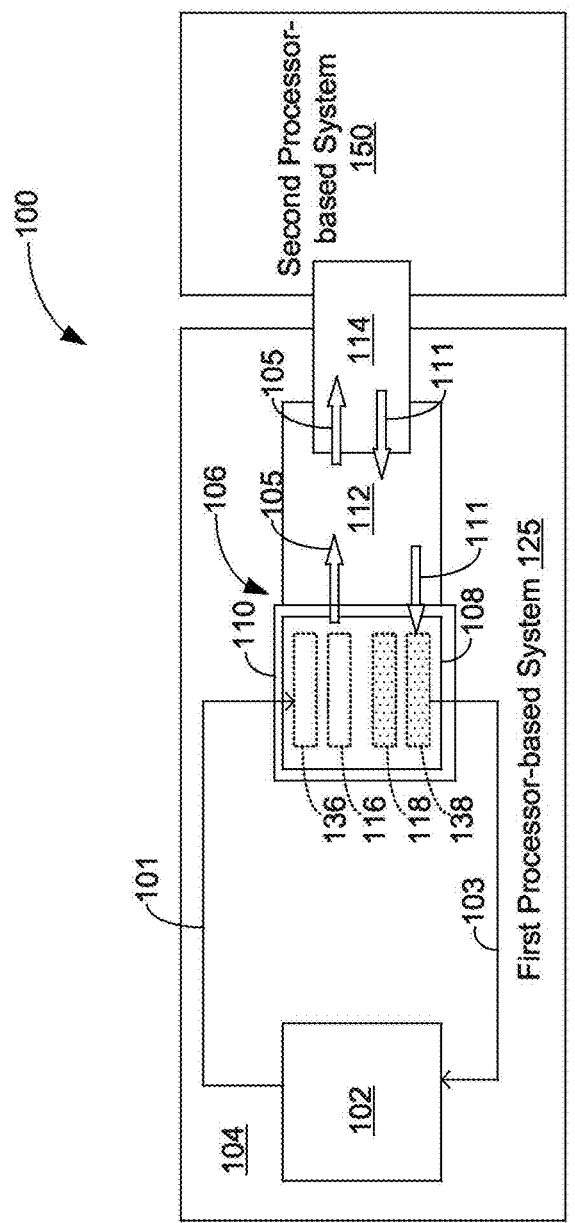
FIG. 1 schematically illustrates a top view of an example optically interconnected system, in accordance with some embodiments.

Embodiments of the present disclosure include techniques and configurations for routing signals of an electro-optical assembly using a glass bridge. For example, the techniques and configurations may relate to routing of electrical and/or optical signals of an electro-optical assembly using the glass bridge. The glass bridge may, for example, be electrically coupled with laser, photodetector, transmitter (Tx) and/or receiver (Rx) components and include electrical routing features to route electrical signals between, for example, the Tx and the laser components and/or the photodetector and the Rx components. In some embodiments, the light signals emitted and/or received by respective laser and/or photodetector components may pass through the glass bridge. In the following detailed description, reference is made to the accompanying drawings which form a part hereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates a top view of an example optically interconnected system 100, in accordance with some embodiments. The optically interconnected system 100 may include a first processor-based system 125 and a second processor-based system 150 coupled together using a system-level optical coupler 114 such as, for example, fiber(s) and/or waveguide(s) to route light in the form of "optical mode" signals (e.g., light signals 105, 111) between the first processor-based system 125 and the second processor-based system 150.

The first processor-based system 125 may include a processor 102 mounted on a substrate 104, which may be a circuit board in some embodiments. The processor 102 may be coupled with an electro-optical (EO) assembly 106 that is configured to convert electrical signals 101 received from the processor 102 including, for example, input/output (I/O) signals into corresponding light signals 105 for routing of the light signals 105 to another device such as second processor-based system 150 that is configured to receive the light signals 105. The electrical signals 101 may include signals that control emission of light signals 105 by the EO assembly 106. The EO assembly 106 may be further configured to receive light signals 111 and convert the light signals 111 into electrical signals 103 sent to the processor 102. In some embodiments, the processor 102 and the EO assembly 106 may be disposed on the same substrate 104. In other embodiments, the processor 102 and the EO assembly 106 may be disposed on different substrates that are operatively coupled together.

The EO assembly 106 may include one or more dies 110 having one or more laser devices (hereinafter "laser device 116") and/or one or more photodetector devices (hereinafter "photodetector device 118") formed on the one or more dies 110. The EO assembly 106 may be an opto-electronic assembly in some embodiments. According to various embodiments, the laser device 116 and photodetector device 118 may be formed on a same die or different dies. The one or more dies 110 may further include dies for one or more transmitter (Tx) devices 136 and/or one or more receiver (Rx) devices 138, which may be formed on a same or different dies according to various embodiments. In some embodiments, the laser device 116 and photodetector device 118 are formed on a different die or dies than the Tx and/or Rx components. The one or more dies 110 may include, for example, a planar lightwave circuit (PLC) and/or optical components such one or more modulators, splitters, gratings, and the like (not shown).

In some embodiments, the EO assembly 106 includes a glass bridge 108 disposed on the one or more dies 110. The laser device 116 and photodetector device 118 are depicted in dashed form to indicate that they underlie the glass bridge 108. The glass bridge 108 may include electrical routing features configured to route electrical signals between components of the EO assembly 106. The glass bridge 108 may be electrically coupled with the one or more dies 110 to route electrical signals of the EO assembly 106 according to techniques and configurations described further herein.

The light signals 105, 111 may be configured to pass through material of the glass bridge 108 according to various embodiments. The glass bridge 108 may be composed of a material that is optically transparent at a wavelength of the light signals 105, 111. In some embodiments, the wavelength of the light signals 105, 111 is from about 850 nanometers (nm) to 1300 nm. Other suitable wavelengths may be used in other embodiments.

In some embodiments, the EO assembly 106 may further include an optical connector element (hereinafter "optical connector 112") coupled with the glass bridge 108 and configured to route the light signals 105, 111 to the system-level optical coupler 114. For the sake of clarity, the optical connector 112 is depicted adjacent to the glass bridge 108, however, in some embodiments, the optical connector 112 may be disposed on the glass bridge 108 (e.g., as depicted in configurations of FIGS. 2-4).

In some embodiments, the second processor-based system 150 is configured to send light signals 111 over the system-level optical coupler 114 to the first processor-based system 125. Although not shown, the second processor-based system 150 may be similarly equipped as the first processor-based system 125 or otherwise comport with embodiments described in connection with the first processor-based system 125. The light signals 111 sent by the second processor-based system 150 may be received by the optical connector 112 of the first processor-based system 125. The optical connector 112 may route the light signals 111 to photodetector device 118 of the EO assembly 106. The processor 102 may be configured to process electrical signals 103 generated by the EO assembly 106 based on the light signals 111 received at the photodetector device 118.

The first processor-based system 125 and/or the second processor-based system 150 may include additional components in some embodiments. For example, the first processor-based system 125 and/or the second processor-based system 150 may comport with embodiments described in connection with the example processor-based system 600 of FIG. 6. In other embodiments, techniques and configurations described herein can be used in a variety of systems that benefit from the principles described herein such as, for example, optical cables, optical links, optical sensors, network hubs, routers, optical backplanes, intra-chip optical links and the like.

Figure 2:
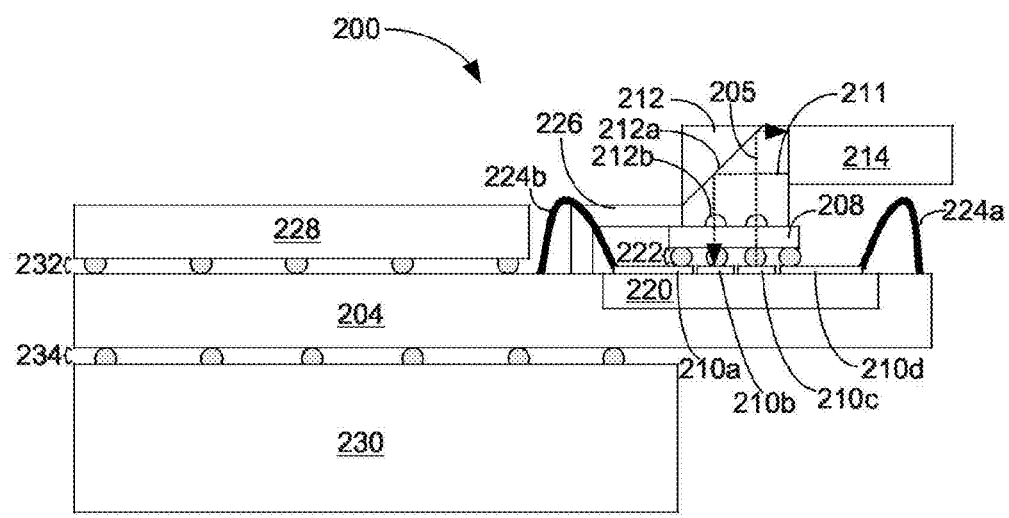
FIG. 2 schematically illustrates an example cross-section side view of an electro-optical (EO) assembly, in accordance with some embodiments.
Figure 3:
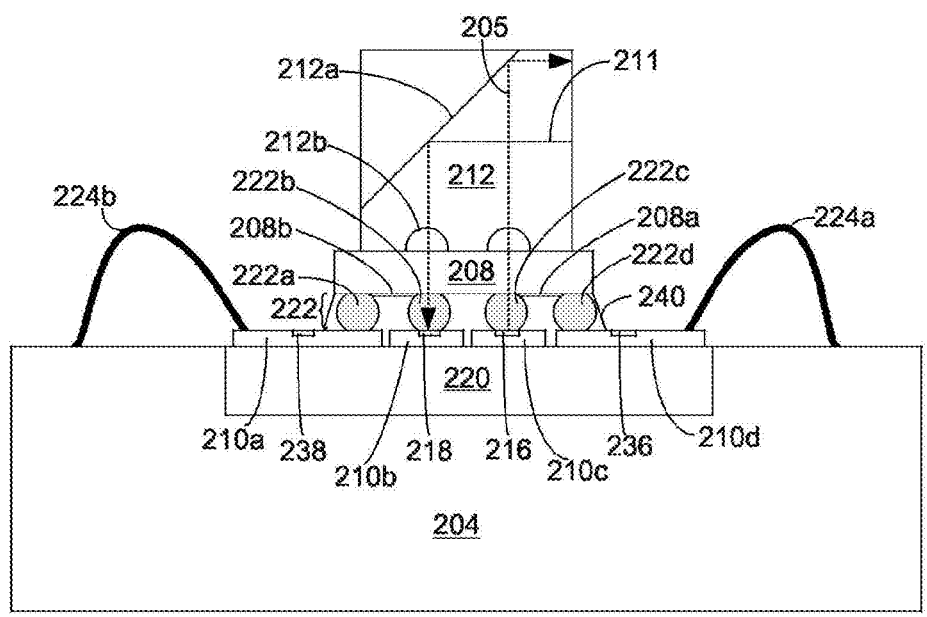
FIG. 3 schematically illustrates a larger cross-section side view of some of the components of the EO assembly of FIG. 2, in accordance with some embodiments.

FIG. 2 schematically illustrates an example cross-section side view of an EO assembly 200, in accordance with some embodiments. FIG. 3 schematically illustrates a larger cross-section side view of some of the components of the EO assembly 200 of FIG. 2, in accordance with some embodiments.

Referring to FIGS. 2 and 3, the EO assembly 200 may comport with embodiments described in connection with the EO assembly 106 of FIG. 1 and vice versa. The EO assembly 200 may include a receiver (Rx) die 210a, photodetector die 210b, laser die 210c, transmitter (Tx) die 210d, interconnect structures 222, glass bridge 208, optical connector 212 and heat spreader element 220, coupled as can be seen. The EO assembly 200 may further include a system-level optical coupler 214, bonding wires 224a and 224b, fastening mechanism 226, substrate 204, retimer assembly 228, plug 230, and interconnect structures 232, 234, coupled as can be seen. According to various embodiments, the EO assembly 200 may include more or fewer components than depicted.

The Tx die 210d may be configured to receive electrical signals, for example, from a processor (e.g., processor 102 of FIG. 1) and send electrical signals to a laser die 210c based on the electrical signals received from the processor for optical transmission. The electrical signals may be received by the Tx die 210d over interconnect structures (e.g., bonding wires 224a) formed between the Tx die 210d and the substrate 204. The Tx die 210d may include one or more transmitter devices (hereinafter "transmitter device 236") formed on an active surface of the Tx die 210d that are configured to receive the electrical signals from the processor and/or drive the laser device 216. The transmitter device 236 may include, for example, one or more transistor devices.

The laser die 210c may have one or more laser devices (hereinafter "laser device 216") formed on an active surface of the laser die 210c. The laser device 216 may be part of an array of laser devices, each of which may be configured to emit light signals 205 based on the electrical signals received from the Tx die 210d. The laser device 216 may include, for example, vertical-cavity surface-emitting lasers (VCSELs) or other suitable light-emitting devices that are configured to emit light signals 205 in a direction that is substantially perpendicular to an active surface of the laser die 210c, as can be seen.

According to various embodiments, a glass bridge 208 may be electrically coupled with the laser die 210c using one or more interconnect structures (hereinafter "interconnect structures 222"). In some embodiments, the interconnect structures 222 may include bumps, balls, pillars, through-glass vias (TGVs) or any other suitable structure including, for example, solderable materials or metals. For example, in some embodiments, the Rx die 210a and/or Tx die 210d may be disposed on a top side of the glass bridge 208 and connect electrically to the corresponding photodetector device 218 and/or laser device 216 of the respective photodetector die 218b and/or laser die 210c that are disposed on a bottom side of the glass bridge 208 through the TGVs. Such configuration may provide Rx die 210a and/or TX die 210d and corresponding photodetector die 218b and/or laser die 210c that are thermally isolated from one another with separate cooling paths. In one embodiment, the interconnect structures 222 may be formed using a fluxless solder such as, for example, an alloy of gold and tin (AuSn) to avoid build up of flux that may adversely affect optical throughput or use of underfill 240. The interconnect structures 222 may include other suitable materials in other embodiments.

In some embodiments, an underfill 240 is deposited between the glass bridge 208 and the dies 210a-d. The underfill 240 may include, for example, an electrically insulative polymer that is optically transparent at a wavelength of the light signals 205, 211. Use of the underfill 240 may reduce optical loss of the light signals 205, 211 relative to air by refractive index matching.

The glass bridge 208 may be composed of a variety of suitable glass materials. The glass bridge 208 may be substantially composed of a wide range of materials that exhibit the glass transition property when heated towards the liquid state. These materials may include, but are not limited to silica ($SiO_2$), borosilicate, photosensitive glass such as photostructurable glass ceramic (PSGC) and the like. The glass bridge 208 may include material configured in amorphous (non-crystalline) form according to various embodiments.

The glass bridge 208 may include a glass substrate upon and/or through which electrical routing features of the glass bridge 208 may be formed. Electrical routing features 208a, 208b may be formed on the glass bridge 208 to route electrical signals of the EO assembly 200. The electrical routing features 208a, 208b may include, for example, pads and/or traces formed on a surface of the glass bridge 208 using well-known semiconductor fabrication techniques such as metal deposition and/or patterning techniques. In some embodiments, the electrical routing features 208a, 208b may further include multi-layer interconnects (e.g., vias, embedded conductive layers, and the like) formed using well-known semiconductor fabrication techniques.

In some embodiments, the electrical routing features 208a may be configured to route electrical signals to the laser die 210c from the transmitter device 236. For example, the electrical signals may be routed from the transmitter device 236 to the laser die 210c using the interconnect structures 222c, 222d and the electrical routing features 208a. In this regard, the glass bridge 208 may serve as a bridge for routing of the electrical signals. The laser device 216 may be configured to emit light signals 205 based on the electrical signals received from the transmitter device 236.

The glass bridge 208 may be positioned in a pathway of the light signals 205 of the laser device 216 such that the light signals 205 and/or 211 pass through the glass bridge 208, as can be seen. For example, in FIGS. 2-3, the interconnect structures 222b, 222c may be positioned in a direction further into the page than the laser device 216 and photodetector device 218 such that the interconnect structures 222b, 222c are not in the pathway of the light signals 205, 211.

The glass bridge 208 may have a thickness (e.g., in a direction of the light signals 205, 211) that is less than 400 microns. In some embodiments, the thickness may be between 200 microns and 400 microns. In one embodiment, the thickness is about 300 microns. A gap between the glass bridge 208 and the dies 210a-d may range from about 3 microns to about 50 microns, according to various embodiments. The glass bridge 208 may have other suitable thicknesses or gap from the dies 210a-d in other embodiments.

In some embodiments, the EO assembly 200 may further include photodetector die 210b having a photodetector device 218 formed on an active surface of the photodetector die 210b. The photodetector device 218 may be an optical element configured to detect light signals 211 received by the EO assembly 200 from a laser device external to the EO assembly 200 (e.g., from a laser device in second processor-based system 150 of FIG. 1). The photodetector device 218 may be part of an array of photodetector devices, each of which may be configured to detect light signals 211.

The photodetector die 210b may be configured to send electrical signals (e.g., over interconnect structure 222b, electrical routing features 208b, and interconnect structure 222a) to one or more receiver devices (hereinafter "receiver device 238") based on the light signals 211. The receiver device 238 may include one or more transistor devices formed on the Rx die 210a. The Rx die 210a may be configured to send electrical signals to a processor (e.g., processor 102 of FIG. 1) based on the electrical signals received from the photodetector die 210b. The receiver device 238 may include a transimpedance amplifier and a limiting amplifier and/or other circuitry to transmit electrical signals to the processor. The electrical signals may be received by the processor over interconnect structures (e.g., bonding wires 224b) formed between the Rx die 210a and the substrate 204.

In some embodiments the electrical signals routed over the glass bridge 208 using interconnect structures 222 and electrical routing features 208a, 208b may include power/ground for one or more of the dies 210a-d. For example, in some embodiments, the Tx die 210d and/or the Rx die 210a may include a power supply and power/ground signals from the power supply may be routed to the laser die 210c and/or the photodetector die 210b from the Tx die 210d and/or the Rx die 210a.

The laser device 216 and the photodetector device 218 may be formed on different dies, as depicted. In other embodiments, the laser device 216 and the photodetector device 218 may be formed on a same die (e.g., a single semiconductor substrate). The functionality described in connection with the laser die 210c and the photodetector device 218 may be integrated on a single die. The transmitter device 236 and the receiver device 238 may be formed on different dies, as depicted. In other embodiments, the transmitter device 236 and the receiver device 238 may be formed on a same die (e.g., a single semiconductor substrate). The functionality described in connection with the Tx die 210d and the Rx die 210a may be integrated on a single die.

In some embodiments, the laser die 210c and the photodetector die 210b are composed of semiconductor materials such as, for example, silicon (Si), germanium (Ge), indium phosphide (InP), gallium arsenide (GaAs), gallium nitride (GaN), group III-V material systems, or suitable combinations thereof. The Tx die 210d and the Rx die 210a may be composed of a semiconductor material such as, for example, silicon (Si). The dies 210a-d may include other suitable materials in other embodiments.

In some embodiments, the glass bridge 208 may include one or more lens array structures (hereinafter "lens array structure 212b") formed on a surface of the glass bridge 208, as can be seen. The lens array structure 212b may be configured to increase coupling efficiency between the glass bridge 208 and the optical connector 212. For example, the lens array structure 212b may provide an expanded or collimated beam of the light signals 205, 211 in the optical connector 212 that may facilitate alignment of the optical connector 212 with the glass bridge 208. The lens array structure 212b may alleviate alignment tolerances between the optical connector 212 and other components such as the laser device 216 and the photodetector device 218. In some embodiments, the lens array structure 212b may be formed directly on the laser device 216 and/or the photodetector device 218 using wafer level fabrication techniques. In some embodiments, the lens array structure 212b may be formed on the optical connector 212. Additional lens array structures may be provided at various interfaces between components along the pathway of the light signals 205, 211.

The optical connector 212 may be optically coupled with the glass bridge 208 to further route the light signals 205, 211. In some embodiments, the optical connector 212 may be coupled with the glass bridge 208 using a suitable adhesive. In other embodiments, the optical connector 212 may be optically coupled with the glass bridge 208 using a fastening mechanism 226 such as a clip or other structure with similar function to hold the optical connector 212 in place. The fastening mechanism may be coupled with the substrate 204 and removably coupled with the optical connector 212 in some embodiments such that the optical connector 212 can be removed from the glass bridge 208 by releasing the fastening mechanism.

The optical connector 212 may be composed of a material that is optically transparent at a wavelength of the light signals 205, 211 such as, for example, a molded polymer including polyetherimide or polyethersoulfone, and/or various types of glass. The optical connector 212 may include other suitable materials in other embodiments. The optical connector 212 may be configured to redirect the light signals 205, 211 by 90 degrees, which may facilitate a smaller form factor or lower profile for the EO assembly 200. In some embodiments, the optical connector 212 may include a reflective surface 212a such as a total internal reflection (TIR) mirror or a metalized mirror to redirect the light signals 205, 211.

The optical connector 212 may be further coupled to a system-level optical coupler 214 to optically couple the light signals 205, 211 with other optical devices external to the EO assembly 200 such as, for example, an optical array structure (e.g., fiber optic or waveguide) and/or an optical joint structure (e.g., multi-terminal (MT) ferrule or micro-joint connector). For example, fiber arrays may be molded into the optical connector 212 or attached with epoxy to form a pigtail assembly. In some embodiments, the optical connector 212 may include one or more alignment guide holes or pins to facilitate coupling with the glass bridge 208 and/or the system-level optical coupler 214. Other suitable structures to optically couple the EO assembly 200 with another EO assembly may be used in other embodiments.

In some embodiments, one or more of the dies 210a-d may have a backside (e.g., inactive surface) that is thermally coupled with the heat spreader element 220. For example, the dies 210a-d may be coupled using any suitable thermal adhesive. The heat spreader element 220 may be composed of a thermally conductive material such as, for example, a metal. The heat spreader element 220 may include a single contiguous structure or multiple discrete elements for each die, according to various embodiments. In some embodiments, the heat spreader element 220 may be embedded in a cut-out portion of the substrate 204. In other embodiments, one or more of the dies 210a-d may be mounted directly on the substrate 204 without a heat spreader element 220.

According to various embodiments, the Tx die 210d and/or the Rx die 210a may be electrically coupled with the substrate 204. The wire-bonding configuration may facilitate alignment of the components (e.g., 210a-d, 222, 208) of the EO assembly 200 with the substrate 204 and/or mitigate non-planar configurations of such components. In the depicted configuration, the Tx die 210d and the Rx die 210a are electrically coupled with the substrate 204 by bonding wires 224a, 224b in a wire-bonding configuration. For example, the Tx die 210d may be configured to receive electrical signals from a processor (e.g., processor 102 of FIG. 1) over the bonding wires 224a and the Rx die 210a may be configured to send electrical signals to the processor over the bonding wires 224b. The bonding wires 224a, 224b may include a variety of suitable materials including, for example, aluminum (Al), copper (Cu), and/or gold (Au) and may be formed using any of a wide variety of suitable techniques including, for example, ball-bonding or wedge-bonding techniques.

The substrate 204 may include electrical routing features (not shown) configured to route electrical signals to or from the dies 210a-d. The electrical routing features may include, for example, traces disposed on one or more surfaces of the substrate 204 and/or internal routing features such as, for example, trenches, vias or other interconnect structures to route electrical signals through the substrate 204. In some embodiments, the substrate 204 is an epoxy-based laminate substrate having a core and/or build-up layers such as, for example, an Ajinomoto Build-up Film (ABF) substrate. In some embodiments, the substrate 204 may be a printed circuit board (PCB) composed of an electrically insulative material such as an epoxy laminate. For example, the substrate 204 may include electrically insulating layers composed of well known prepreg materials used in the PCB industry such as, for example, FR-2 (Phenolic cotton paper), FR-3 (Cotton paper and epoxy), FR-4 (Woven glass and epoxy), FR-5 (Woven glass and epoxy), FR-6 (Matte glass and polyester), G-10 (Woven glass and epoxy), CEM-1 (Cotton paper and epoxy), CEM-2 (Cotton paper and epoxy), CEM-3 (Non-woven glass and epoxy), CEM-4 (Woven glass and epoxy), CEM-5 (Woven glass and polyester) and the like. The substrate 204 may include other suitable types of substrates in other embodiments including, for example, substrates formed from glass, ceramic, or semiconductor materials.

In some embodiments, the EO assembly 200 may further include a retimer assembly 228 disposed on a surface of the substrate 204 and electrically coupled with the transmitter device 236 and/or the receiver device 238 through the substrate 204. For example, interconnect structures 232 may couple the retimer assembly 228 with the substrate 204 and bonding wires 224a, 224b may route electrical signals between the retimer assembly 228 and the Tx die 210d and/or the Rx die 210a for retiming transmission and/or reception of the light signals 205, 211. In some embodiments, the retimer assembly 228 is a die composed of a semiconductor material having circuitry configured to perform retiming of signaling (e.g., light signals 205, 211) of the EO assembly 200. The interconnect structures 232 may include, for example, bumps, pillars, balls or other suitable structures.

A plug 230 may be coupled with the substrate 204 using interconnect structures 234. In some embodiments, the plug 230 may be disposed on a surface of the substrate 204 that is opposite to the surface on which the retimer assembly 228 is disposed, as can be seen. The plug 230 may be used to electrically couple the EO assembly 200 with other electrical components such as, for example, another circuit board such as, for example, a motherboard. For example, the plug 230 may function similar to a socket and may enable upgrade of a system in the field. The interconnect structures 232 may include, for example, bumps, pillars, balls or other suitable structures. In other embodiments, the EO assembly 200 may not include a plug 230 and the components of the EO assembly 200 may be directly coupled with a substrate such as, for example, a printed circuit board (PCB) or other suitable substrate.

The EO assembly 200 may be fabricated according to a variety of suitable techniques. For example, according to various embodiments, the retimer assembly 228 may be coupled with the substrate 204 using a solder reflow process. An underfill material may be deposited between the retimer assembly 228 and the substrate 204. The heat spreader element 220 may be attached to a cutout region of the substrate 204. The dies 210a-d may be attached to the heat spreader element 220. The dies 210a-d may be placed using a placement accuracy in the range of 2 microns to 5 microns to facilitate optical alignment with the glass bridge 208 and/or optical connector 212. The Tx die 210d and/or the Rx die 210a may be electrically coupled with the substrate 204 using bonding wires 224a, 224b. In other embodiments (not shown), a silicon interposer or bridge may be used to electrically couple the dies 210a-d with the substrate. The plug 230 may be coupled with the substrate 204 using a solder reflow process. A heat spreader (not shown) may be thermally coupled with the retimer assembly 228 in some embodiments. The glass bridge 208 may be coupled with the dies 210a-d using a solder reflow process. Underfill 240 may be deposited between the glass bridge and the dies 210a-d. The optical connector 212 may be coupled with the glass bridge 208 using an adhesive or fastening mechanism 226. Metal casing (not shown) may be coupled with components of the EO assembly 200 such as, for example, the retimer assembly 228 and/or the heat spreader element 220 to provide a thermal conduction path away from the EO assembly 200.

Fabrication of the EO assembly 200 may be performed in the sequence described above in some embodiments. In other embodiments, the actions to fabricate the EO assembly 200 may be performed in other suitable sequential order.

Figure 4:
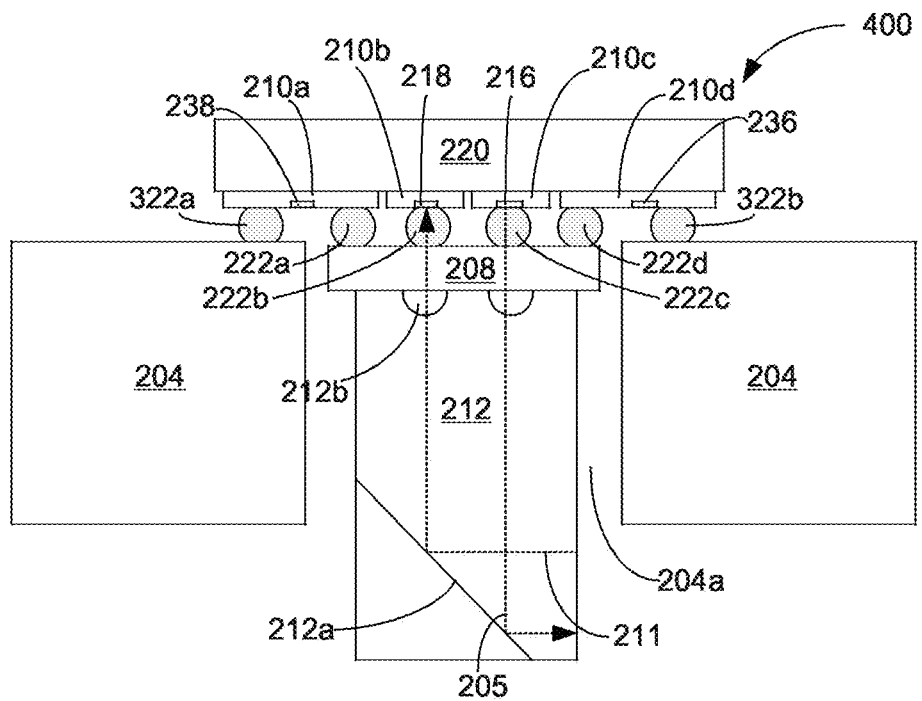
FIG. 4 schematically illustrates a cross-section side view of an EO assembly having components coupled with a substrate in a flip-chip configuration, in accordance with some embodiments.

FIG. 4 schematically illustrates a cross-section side view of an EO assembly 400 having components coupled with a substrate 204 in a flip-chip configuration, in accordance with some embodiments. According to various embodiments, components of the EO assembly 400 may comport with embodiments described in connection with similarly numbered components of the EO assembly 200 of FIGS. 2-3 and vice versa. The EO assembly 400 of FIG. 4 may further include components of the EO assembly 200 of FIGS. 2-3 that are not depicted in FIG. 4.

The Tx die 210d and/or the Rx die 210a may be electrically coupled with the substrate 204 in a flip-chip configuration, as can be seen. The flip-chip configuration may provide an EO assembly 400 having a smaller Z dimension of a three plane (X, Y, Z) coordinate system where the X and Y plane is defined by a surface of the substrate 204 relative to the wirebonding configuration of FIG. 2. The substrate 204 may include a through-hole opening 204a and the Tx die 210d and/or the Rx die 210a may be flip-chip coupled with a surface of the substrate 204 using interconnect structures 322a such as, for example, bumps, pillars or balls. A pathway of the light signals 205, 211 may be configured to pass through the through-hole opening 204a. In some embodiments, the glass bridge 208 and/or the optical connector 212 may be disposed in the through-hole opening 204a.

The EO assembly 400 may be fabricated using a variety of suitable techniques. For example, according to various embodiments, the sequence of actions described in connection with fabrication of the EO assembly 200 may be used and modified according to the following actions. In the fabrication of the EO assembly 400, the dies 210a-d may be attached to the heat spreader element 220 and the glass bridge 208 may be coupled with the dies 210a-d to form an EO module. A through-hole opening 204a may be formed through the substrate 204 using, for example, a cutting, milling or drilling process. The EO module may be flip-chip coupled with the substrate 204 (e.g., using interconnect structures 322a, 322b) and the retimer assembly (e.g., retimer assembly 228 of FIG. 2) may be coupled with the substrate using a same reflow process. The plug (e.g., plug 230 of FIG. 2) may be coupled with the substrate 204 using another reflow process. The optical connector 212 may be coupled with the glass bridge 208 through the through-hole opening. A metal casing (not shown) may be coupled in thermal contact with the retimer assembly and the heat spreader element 220.

Fabrication of the EO assembly 400 may be performed in the sequence described above in some embodiments. In other embodiments, the actions to fabricate the EO assembly 400 may be performed in other suitable sequential order.

Figure 5:
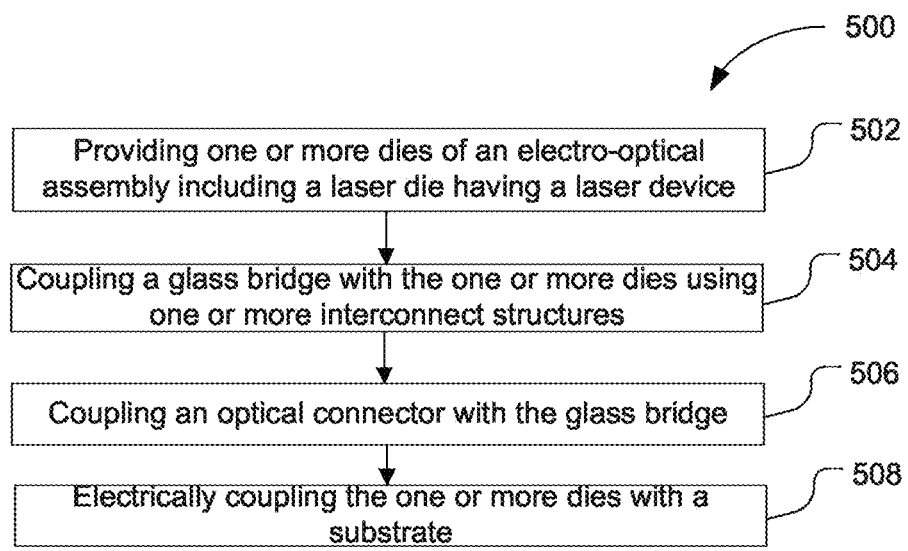
FIG. 5 is a flow diagram for a method of fabricating an EO assembly, in accordance with some embodiments.

FIG. 5 is a flow diagram for a method 500 of fabricating an EO assembly (e.g., the EO assembly 200 of FIG. 2-3 or 400 of FIG. 4), in accordance with some embodiments. The method 500 may comport with techniques described in connection with FIGS. 1-4 and vice versa.

At 502, the method 500 may include providing one or more dies (e.g., dies 210a-d of FIGS. 2-4) of an electro-optical assembly (e.g., EO assembly 200 or 400 of respective FIG. 2-3 or 4) including a laser die (e.g., laser die 210c of FIGS. 2-4) having a laser device (e.g., laser device 216 of FIGS. 2-4). The one or more dies may be thermally coupled with a heat spreader element (e.g., heat spreader element 220 of FIGS. 2-4) in some embodiments. For example, a thermal adhesive may be used to couple an inactive surface of the one or more dies with the heat spreader element.

In some embodiments, the one or more dies may include a Tx die, Rx die, laser die and photodetector die. The Tx die and the Rx die may be a same die and/or the laser die and the photodetector die may be another same die in various embodiments. In this regard, coupling the Tx die and the Rx die with the glass bridge may include coupling the same die with the glass bridge or coupling the laser die and the photodetector die may include coupling another same die with the glass bridge.

At 504, the method 500 may include coupling a glass bridge (e.g., glass bridge 208 of FIGS. 2-4) with the one or more dies using one or more interconnect structures (e.g., interconnect structures 222a-d of FIGS. 2-4). The glass bridge may include electrical routing features configured to route electrical signals to the laser die from a transmitter device (e.g., transmitter device 236 of FIGS. 2-4). The one or more interconnect structures may include, for example, bumps, pillars, balls and the like. The glass bridge may be coupled with the one or more dies using a solder reflow process to form electrical joints.

In some embodiments, coupling the glass bridge with the laser die may include positioning the glass bridge in a pathway of light signals (e.g., light signals 205 of FIGS. 2-4) such that the light signals are configured to pass through the glass bridge subsequent to coupling the glass bridge with the laser die. In some embodiments, coupling the glass bridge with the laser die may include depositing an underfill material between one or more of the one or more dies and the glass bridge.

At 506, the method 500 may include coupling an optical connector (e.g., optical connector 212 of FIGS. 2-4) with the glass bridge. The optical connector may be coupled using an adhesive in some embodiments. In other embodiments, the optical connector may be coupled using a mechanism (e.g., fastening mechanism 226 of FIG. 2) that allows the optical connector to be removed from the glass bridge with ease relative to an adhesive.

At 508, the method 500 may include electrically coupling the one or more dies with a substrate (e.g., substrate 204 of FIGS. 2-4). In some embodiments, the one or more dies are electrically coupled with the substrate in a wire-bonding configuration (e.g., as depicted in FIGS. 2-3). For example, the Tx die and/or the Rx die may be coupled with the substrate using bonding wires (e.g., bonding wires 224a, 224b). In other embodiments, the one or more dies are electrically coupled with the substrate in a flip-chip configuration (e.g., as depicted in FIG. 4). A through-hole opening may be formed in the substrate 204 to facilitate fabrication of the flip-chip configuration. Coupling the optical connector at 506 may be performed through the through-hole opening in some embodiments. In some embodiments, a retimer assembly (e.g., retimer assembly 228 of FIG. 2) and/or plug (e.g., plug 230 of FIG. 2) may be coupled with the substrate using one or more solder reflow processes.

Figure 6:
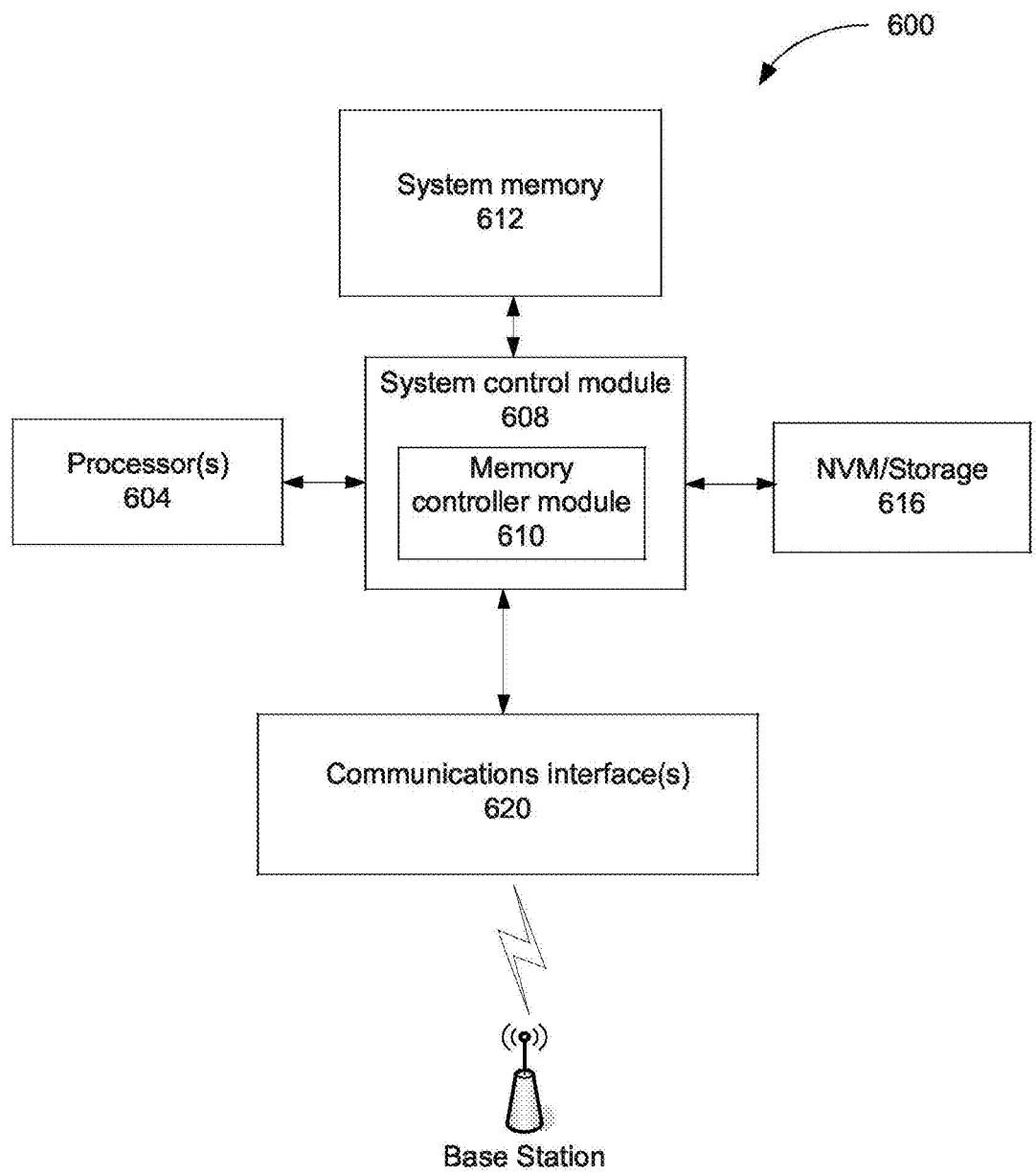
FIG. 6 schematically illustrates an example processor-based system that may be part of or include an optically interconnected system described herein in accordance with some embodiments.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired. FIG. 6 schematically illustrates an example processor-based system 600 that may be part of an optical communication system (e.g., optically interconnected system 100) described herein, in accordance with some embodiments. The example processor-based system 600 may represent, for example, the first processor-based system 125 or the second processor-based system 150 of FIG. 1 having a glass bridge (e.g., glass bridge 108 of FIG. 1 or 208 of FIGS. 2-4) as described herein, according to various embodiments. In one embodiment, the processor-based system 600 includes one or more processor(s) 604. One of the one or more processor(s) 604 may correspond, for example, with the processor 102 of FIG. 1.

The processor-based system 600 may further include system control module 608 coupled to at least one of the processor(s) 604, system memory 612 coupled to system control module 608, non-volatile memory (NVM)/storage 616 coupled to system control module 608, and one or more communications interface(s) 620 coupled to system control module 608.

System control module 608 for one embodiment may include any suitable interface controllers to provide for any suitable interface to at least one of the processor(s) 604 and/or to any suitable device or component in communication with system control module 608.

System control module 608 may include a memory controller module 610 to provide an interface to system memory 612. The memory controller module 610 may be a hardware module, a software module, and/or a firmware module.

System memory 612 may be used to load and store data and/or instructions, for example, for processor-based system 600. System memory 612 for one embodiment may include any suitable volatile memory, such as suitable Dynamic Random Access Memory (DRAM), for example.

System control module 608 for one embodiment may include one or more input/output (I/O) controller(s) to provide an interface to NVM/storage 616 and communications interface(s) 620.

The NVM/storage 616 may be used to store data and/or instructions, for example. NVM/storage 616 may include any suitable non-volatile memory, such as Phase Change Memory (PCM) or flash memory, for example, and/or may include any suitable non-volatile storage device(s), such as one or more hard disk drive(s) (HDD(s)), one or more compact disc (CD) drive(s), and/or one or more digital versatile disc (DVD) drive(s), for example.

The NVM/storage 616 may include a storage resource physically part of a device on which the processor-based system 600 is installed or it may be accessible by, but not necessarily a part of, the device. For example, the NVM/storage 616 may be accessed over a network via the communications interface(s) 620.

Communications interface(s) 620 may provide an interface for processor-based system 600 to communicate over one or more wired or wireless network(s) and/or with any other suitable device. For example, in some embodiments, the communication interface(s) 620 may be configured to communicate wirelessly over a wireless link established with a base station of a wireless communication network (e.g., radio access network (RAN) and/or core network). The communication interface(s) 620 may be configured with a transmitter, receiver, or transceiver to wirelessly transmit/receive signals according to various communication protocols including, for example, broadband wireless access (BWA) networks including networks operating in conformance with one or more protocols specified by the $3^{rd}$ Generation Partnership Project (3GPP) and its derivatives, the WiMAX Forum, the Institute for Electrical and Electronic Engineers (IEEE) 802.16 standards (e.g., IEEE 802.16-2005 Amendment), long-term evolution (LTE) project along with any amendments, updates, and/or revisions (e.g., advanced LTE project, ultra mobile broadband (UMB) project (also referred to as "3GPP2"), etc.).

The communication interface(s) 620 may be configured to communicate using additional/alternative communication standards, specifications, and/or protocols. For example, the communication interface(s) 620 may be configured to communicate with wireless local area networks (WLANs), wireless personal area networks (WPANs) and/or wireless wide area networks (WWANs) such as cellular networks (e.g., 2G, 3G, 4G, 5G, etc.) and the like. The communication interface (s) 620 may be configured to communicate according to technologies such as Evolution-Data Optimized (Ev-DO), Evolved High-Speed Packet Access (HSPA+), High-Speed Download Packet Access (HSDPA+), High-Speed Uplink Packet Access (HSUPA), Global System for Mobile communications (GSM), Enhanced Data GSM Environment (EDGE), General Packet Radio Service (GPRS), Code Division Multiple Access (CDMA), Time Division Multiple Access (TDMA), Digital Enhanced Cordless Telecommunications (DECT), Bluetooth, or derivatives thereof. The processor-based system 600 may include a plurality of communication chips (e.g., processor(s) 604). For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

For one embodiment, at least one of the processor(s) 604 may be packaged together with logic for one or more controller(s) of system control module 608, e.g., memory controller module 610. For one embodiment, at least one of the processor(s) 604 may be packaged together with logic for one or more controllers of system control module 608 to form a System in Package (SiP). For one embodiment, at least one of the processor(s) 604 may be integrated on the same die with logic for one or more controller(s) of system control module 608. For one embodiment, at least one of the processor(s) 604 may be integrated on the same die with logic for one or more controller(s) of system control module 608 to form a System on Chip (SoC).

In various embodiments, the processor-based system 600 may be, but is not limited to, a server, a workstation, a desktop computing device, or a mobile computing device (e.g., a laptop computing device, a handheld computing device, a handset, a tablet, a smartphone, a netbook, ultrabook, etc.). In various embodiments, the processor-based system 600 may have more or less components, and/or different architectures. For example, in some embodiments, the processor-based system 600 may include one or more of a camera, a keyboard, display such as a liquid crystal display (LCD) screen (including touch screen displays), a touchscreen controller, non-volatile memory port, antenna or multiple antennas, graphics chip, ASIC, speaker(s), a battery, an audio codec, a video codec, a power amplifier, a global positioning system (GPS) device, a compass, an accelerometer, a gyroscope, and the like. In various embodiments, the processor-based system 600 may have more or less components, and/or different architectures.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An electro-optical assembly, the assembly comprising:
a heat spreader element with a substantially flat surface;
a laser die disposed on the substantially flat surface of the heat spreader element and having a laser device to emit light signals; and
a glass bridge electrically coupled with the laser die by one or more interconnect structures, the glass bridge including electrical routing features configured to route electrical signals to the laser die from a transmitter device, wherein the glass bridge and the heat spreader element form a structure that is free of cutouts or hole-forming structures to lodge the laser die.

2. The assembly of claim 1, wherein:
the laser device is disposed on an active surface of the laser die;
the laser device is configured to emit light signals in a direction that is substantially perpendicular to the active surface; and
the glass bridge is positioned in a pathway of the light signals of the laser device such that the light signals pass through the glass bridge.

3. The assembly of claim 2, further comprising:
an optical connector removably coupled with the glass bridge by a fastening mechanism and configured to receive and route the light signals from the laser device, the optical connector being composed of a material that is optically transparent at a wavelength of the light signals.

4. The assembly of claim 2, wherein the laser device is a vertical-cavity surface-emitting laser (VCSEL) of an array of VCSELs disposed on the active surface.

5. The assembly of claim 1, wherein:
an inactive surface of the laser die is coupled with the heat spreader element;
the transmitter device is part of a transmitter die coupled with the heat spreader element;
the transmitter die is electrically coupled with the glass bridge by bumps configured to route the electrical signals between the transmitter die and the glass bridge;
the electrical signals include signals that control emission of light signals by the laser device; and
the one or more interconnect structures include bumps.

6. The assembly of claim 5, wherein:
the glass bridge comprises silica;
the laser die comprises germanium (Ge), indium phosphide (InP), gallium arsenide (GaAs), or gallium nitride (GaN); and
the transmitter die comprises silicon (Si).

7. The assembly of claim 5, wherein the light signals are first light signals, the electrical routing features are first electrical routing features and the electrical signals are first electrical signals, the apparatus further comprising:
a photodetector device coupled with the heat spreader element and configured to receive second light signals and convert the second light signals to second electrical signals, the photodetector device being electrically coupled with the glass bridge by bumps; and
a receiver device coupled with the heat spreader element and electrically coupled with the glass bridge by bumps, wherein the glass bridge further includes second electrical routing features configured to route the second electrical signals from the photodetector device to the receiver device.

8. The assembly of claim 7, wherein:
the photodetector device is part of a photodetector die that is a same or different die than the laser die;
the receiver device is part of a receiver die that is a same or different die than the transmitter die; and
the glass bridge is positioned in a pathway of the second light signals such that the second light signals pass through the glass bridge.

9. The assembly of claim 8, further comprising a substrate, wherein the transmitter die and the receiver die are electrically coupled with the substrate.

10. The assembly of claim 9, wherein the transmitter die and the receiver die are electrically coupled with the substrate by bonding wires.

11. The assembly of claim 9, wherein:
the transmitter die and the receiver die are electrically coupled with the substrate by bumps in a flip-chip configuration; and
the substrate includes a through-hole opening, wherein a pathway of the first light signals and the pathway of the second light signals are configured to pass through the through-hole opening.

12. The assembly of claim 9, further comprising:
a retimer assembly disposed on a first surface of the substrate, the retimer assembly being electrically coupled with the transmitter device and the receiver device through the substrate; and
a plug disposed on a second surface of the substrate that is opposite to the first surface.

13. The assembly of claim 1, further comprising:
an underfill material disposed between the laser die and the glass bridge, the underfill material being composed of a material that is optically transparent at a wavelength of light signals emitted by the laser device.

14. A method of fabricating an electro-optical assembly, the method comprising:
providing a heat spreader element with a substantially flat surface;
disposing a laser die having a laser device on the substantially flat surface of the heat spreader element; and
coupling a glass bridge with the laser die using one or more interconnect structures, the glass bridge including electrical routing features configured to route electrical signals to the laser die from a transmitter device, the glass bridge and the heat spreader element forming a structure that is free of cutouts or hole-forming structures to lodge the laser die.

15. The method of claim 14, wherein coupling the glass bridge with the laser die comprises:
positioning the glass bridge in a pathway of light signals of the laser device such that the light signals are configured to pass through the glass bridge subsequent to coupling the glass bridge with the laser die.

16. The method of claim 15, further comprising:
coupling an optical connector with the glass bridge using a mechanism that allows the optical connector to be removed from the glass bridge, the optical connector being configured to receive and route the light signals from the laser device and composed of a material that is optically transparent at a wavelength of the light signals.

17. The method of claim 14, wherein the transmitter device is part of a transmitter die and the light signals are first light signals, the method further comprising:
coupling the laser die and the transmitter die to the heat spreader element;
coupling the transmitter die with the glass bridge using bumps configured to route the electrical signals between the transmitter die and the glass bridge, wherein the electrical signals include signals that control emission of light signals by the laser device and the one or more interconnect structures include bumps;
coupling a photodetector die with the heat spreader element, the photodetector die being configured to receive second light signals and convert the second light signals to second electrical signals; and
coupling the photodetector die with the glass bridge using bumps.

18. The method of claim 17, wherein the electrical routing features are first electrical routing features and the electrical signals are first electrical signals, the method further comprising:
coupling a receiver die with the heat spreader element; and
coupling the receiver die with the glass bridge using bumps, wherein the glass bridge further includes second electrical routing features configured to route the second electrical signals from the photodetector die to the receiver die and wherein coupling the receiver die with the glass bridge includes positioning the glass bridge in a pathway of the second light signals such that the second light signals pass through the glass bridge subsequent to coupling the receiver die with the glass bridge.

19. The method of claim 18, wherein:
the transmitter die and the receiver die are a same die;
coupling the receiver die with the glass bridge and coupling the transmitter die with the glass bridge comprise coupling the same die with the glass bridge;
the laser die and the photodetector die are another same die; and
coupling the laser die with the glass bridge and coupling the photodetector die with the glass bridge comprise coupling the another same die with the glass bridge.

20. The method of claim 18, further comprising:
electrically coupling the transmitter die and the receiver die with a substrate.

21. The method of claim 20, wherein electrically coupling the transmitter die and the receiver die with the substrate includes bonding wires to the transmitter die and the substrate and bonding wires to the receiver die and the substrate.

22. The method of claim 20, wherein electrically coupling the transmitter die and the receiver die with the substrate includes attaching the transmitter die with substrate in a flip-chip configuration using bumps and attaching the receiver die with the substrate in a flip-chip configuration using bumps, the method further comprising:
forming a through-hole opening through the substrate, wherein a pathway of the first light signals and the pathway of the second light signals are configured to pass through the through-hole opening.

23. A system comprising:
a processor; and
an electro-optical (EO) assembly coupled with the processor, the EO assembly comprising:
a heat spreader element with a substantially flat surface;
a laser die disposed on the substantially flat surface of the heat spreader element and having a laser device to emit light signals; and
a glass bridge electrically coupled with the laser die by one or more interconnect structures, the glass bridge including electrical routing features
configured to route electrical signals to the laser die from a transmitter device, wherein the glass bridge and the heat spreader element form a structure that is free of cutouts or hole-forming structures to lodge the laser die,
wherein the electrical signals are based on input/output (I/O) signals of the processor.

24. The system of claim 23, wherein:
the laser device is disposed on an active surface of the laser die;
the laser device is configured to emit light signals in a direction that is substantially perpendicular to the active surface; and
the glass bridge is positioned in a pathway of the light signals of the laser device such that the light signals pass through the glass bridge.

25. The system of claim 23, wherein the system is one of a server, a workstation, a desktop computing device, or a mobile computing device.

* * * * *